United States Patent [19]

Nagahara et al.

[11] Patent Number: 4,737,197
[45] Date of Patent: Apr. 12, 1988

[54] SOLAR CELL WITH METAL PASTE CONTACT

[75] Inventors: Yoshiyuki Nagahara; Akira Shibata; Masahito Asai, all of Nara; Shinichi Nakajima, Osaka; Nobuyuki Takamori, Nara, all of Japan

[73] Assignee: Sharp Kabushiki Kaisha, Osaka, Japan

[21] Appl. No.: 839,198

[22] Filed: Mar. 13, 1986

[30] Foreign Application Priority Data

Aug. 29, 1985 [JP] Japan ................. 60-191243

[51] Int. Cl.$^4$ ............................................. H01L 31/06
[52] U.S. Cl. ..................................... 136/256; 357/30; 357/65; 357/67; 437/2; 437/188
[58] Field of Search ................ 136/256; 29/572, 589; 427/88; 357/30, 65, 67; 437/2, 188

[56] References Cited

U.S. PATENT DOCUMENTS

| | | | |
|---|---|---|---|
| 4,163,678 | 8/1979 | Bube | 136/256 |
| 4,219,448 | 8/1980 | Ross | 252/500 |
| 4,235,644 | 11/1980 | Needes | 136/256 |
| 4,336,281 | 6/1982 | van Mourik | 427/74 |
| 4,361,718 | 11/1982 | Marcus et al. | 136/256 |
| 4,375,007 | 2/1983 | Marcus | 136/256 |

FOREIGN PATENT DOCUMENTS 55-103775  8/1980  Japan ................... 136/256

*Primary Examiner*—Aaron Weisstuch
*Attorney, Agent, or Firm*—Birch, Stewart, Kolasch, & Birch

[57] ABSTRACT

A solar cell including a semiconductor substrate, a diffused layer provided in the semiconductor substrate by diffusion of dopant impurities, and a contact made of metal paste formed on the diffusion layer. The metal paste includes metal powder which functions as the main contact material, glass frits, an organic binder, a solvent, and an element belonging to the fifth group of the periodic table.

5 Claims, 1 Drawing Sheet

SOLAR CELL WITH METAL PASTE CONTACT

BACKGROUND OF THE INVENTION

The present invention relates to a solar cell and, more particularly, to a pn junction type solar cell which includes a pn junction in a semiconductor substrate and which further includes an electrode (or contact) made of a metal paste containing an element belonging to the fifth (V) group of the periodic table.

In a conventional pn junction type solar cell, ohmic contact between the front contact and a diffused layer of a semiconductor substrate may be hard to obtain. This is the reason why an anti-reflection coating made of an electrically insulating material is formed between the front contact and the diffused layer of the semiconductor substrate. However, in such a construction, the fill-factor (F.F.) of the current-voltage (I–V) characteristic may be decreased, and energy conversion efficiency may be lowered.

SUMMARY OF THE INVENTION

Accordingly, it is an object of the present invention to provide an improved solar cell having a sufficiently low resistance ohmic contact between the front surface electrode and a diffused layer of the semiconductor substrate so that energy conversion efficiency is high.

It is another object of the present invention to provide an improved solar cell which includes a front contact made of a metal paste, the metal paste comprising metal powder, glass frits, an organic binder, a solvent, and at least one element from the fifth group of the periodic table.

Other objects and further scope of applicability of the present invention will become apparent from the detailed description given herinafter. It should be understood, however, that the detailed description of and specific examples, while indicating preferred embodiments of the invention, are given by way of illustration only, since various changes and modifications within the spirit and scope of the invention will become apparent to those skilled in the art from this detailed description.

To achieve the above objects, according to an embodiment of the present invention, a solar cell comprises a semiconductor substrate, a diffused layer provided in the semiconductor substrate to form a pn junction layer, and a front contact provided on the diffused layer of the semiconductor substrate, the material of the front contact being a metal paste including metal powder, glass frits, and an element belonging to the fifth group of the periodic table.

The metal paste may also include an organic binder and a solvent.

BRIEF DESCRIPTION OF THE DRAWINGS

The present invention will be better understood from the detailed description given hereinbelow and the accompanying drawings which are given by way of illustration only, and thus are not limitative of the present invention and wherein.

DETAILED DESCRIPTION OF THE PREFERRED EMBODIMENTS

Figure 1:
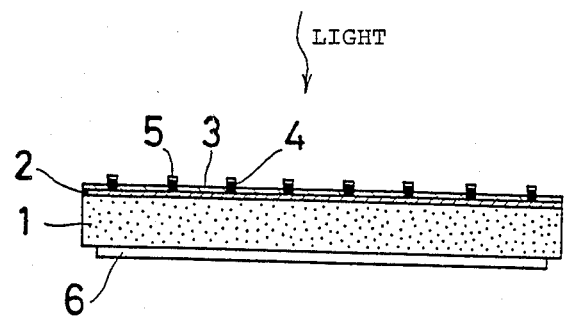
FIG. 1 shows a sectional view of a solar cell arrangement according to an embodiment of the present invention.

An embodiment of the present invention will be described below with reference to FIG. 1 showing a sectional view of a solar cell arrangement according to an embodiment of the present invention. An n+ type diffused layer 2 is formed in a p type silicon (Si) substrate by diffusing active impurities in the semiconductor substrate 1. An anti-reflection coating 3 is formed on the diffused layer 2 to prevent light or sunshine from reflecting off of the surface of the solar cell, and may be made of $SiO_2$, $TiO_2$, or the like. Front contacts 4 are provided on the semiconductor substrate 1 and function as a negative polarity contact. The front contacts 4 are known as a grid contact. Solder layers 5 are formed on the front contacts to decrease series resistance and to improve the reliability of the solar cell. Rear contacts 6, for example, made of Al (Aluminum) paste, are formed on the rear side of the substrate 1, and function as a positive polarity contact.

In the solar cell of the present invention, the active impurities are shallowly diffused into the semiconductor substrate, which for example is made of single-crystal silicon, so that the pn junction layer is formed adjacent the surface of the substrate. To prevent light or the sunshine from reflecting off of the surface of the solar cell, the anti-reflection coating made of $SiO_2$, $TiO_2$, or the like, is coated on the front surface of the semiconductor substrate. On the front surface of the semiconductor substrate, the front contacts are formed by the metal paste such as an Ag (Silver) paste including glass frits. In one known process, the front contacts are directly printed on the anti-reflection coating and fired. Therefore, the front contacts penetrate the anti-reflection coating so that they are formed on the diffused layer of the semiconductor substrate. Accordingly, good ohmic contact between the front contact and the diffusion layer of the semiconductor substrate can be obtained. This manufacturing method is called the fire-through method.

In the solar cell manufactured by the fire-through method, the ohmic contact between the front contact and the diffusion layer of the semiconductor substrate may be hard to obtain in undamaged condition because the anti-reflection coating provided on the diffusion layer of the substrate is made of an electrically insulating material such as $TiO_2$, $SiO_2$, or the like.

To overcome the above problem, the front contacts 4 according to the embodiment of the present invention are made of metal paste including an element belonging to the fifth (V) group of the periodic table, for example, an Ag paste containing a small quantity of P (Phosphorus) belonging to the fifth group of the periodic table or a phosphorus compound. The quantity of P or P compound added to the Ag paste may be selected from the range of about 0.05 wt % to about 0.3 wt %. The Ag paste further comprises an organic binder, a solvent, and an agent in addition to the P or P-containing compound.

Because of the small quantity of P or P compound added to the Ag paste, the front contacts 4 are completely fired-through the anti-refleciton coating 3 and are in sufficiently low resistance contact with the diffusion layer 2 due to a synergistic effect between the glass frits and P or P compound included in the Ag paste when the Ag paste is fired. Accordingly, the fill-factor can be improved and the energy conversion efficiency can be increased.

The front contacts 4 are manufactured by the fire-through method such that the Ag paste is directly printed on the anti-reflection coating 3 and fired, and sufficiently low resistance ohmic contact between the front contact and the diffused layer of the substrate is obtained. Prior to the steps of forming the anti-reflection coating and ohmic contact by the fire-through method, n-type impurities such as P are diffused at about 950 degrees C. into the p-type silicon substrate 1 having a thickness of about 400 μm and a bulk resistivity between about 0.5 ohm-cm and about 10.0 ohm-cm to form the n-type diffused layer 2 having a thickness between about 0.3 μm and about 1.0 μm.

Next, a $TiO_2$ layer having a thickness between about 700 A and about 800 A is formed on the surface of the diffused layer 2 as the anti-reflection coating 3 by a spin-on method, a dip method, or a chemical vapor deposition (CVD) method. A1 paste is then screen-printed on the rear surface of the p-type silicon substrate 1 and fired at about 800 degrees C., thereby forming back contact 6. The Ag paste is then screen-printed on the anti-reflection coating 3 and fired at a temperature between 600 degrees and about 700 degrees C. to form the front contacts 4. To improve the reliability of the solar cell and decrease the series resistance, the front contact of the solar cell is coated with solder through a dipping process to provide the solder layer 5. The solar cell as shown in FIG. 1 is thereby obtained.

Because the front contact 4 used in the embodiment of the present invention is made of Ag paste containing a small quantity of phosphorus (P) from the fifth group of the periodic table or a phosphorus-containing compound, the ohmic contact between the front contact 4 and the diffusion layer 2 of the substrate is improved due to the synergistic effect between the glass frits and P or the P compound included in the Ag paste. The contact resistance of the ohmic contact is reduced, the fill-factor improved, and the light energy conversion efficiency increased.

Figure 2:
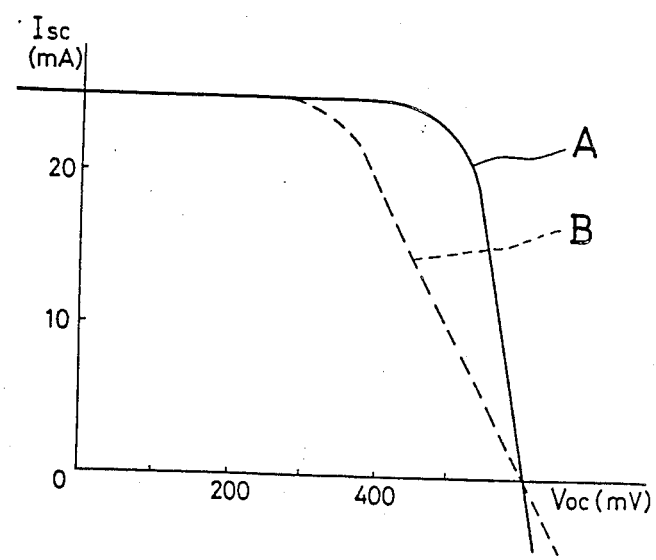
FIG. 2 shows current-voltage characteristics of a solar cell of the present invention in comparison with a conventional solar cell.

FIG. 2 shows current-voltage (I–V) characteristics of the solar cell of the present invention and a conventional solar cell. The horizontal axis is the output voltage when light is applied to the solar cell. The vertical axis is the output current amount when light is applied to the solar cell. The characteristic of the solar cell including front contacts made of Ag paste not containing P or P compound is designated by the broken line B. The characteristic of the solar cell according to the embodiment of the present invention including front contacts made of Ag paste with P or P compound is designated by the continuous line A. In the conventional solar cell, the contact resistance between the front contacts and the diffused layer is large, and the fill-factor if about 0.5. In the solar cell of the present invention, the contact resistance between the front contacts and the diffused layer is decreased in comparison with the conventional solar cell. Therefore, the output of the solar cell is larger than that of the conventional solar cell. The fill-factor is improved to about 0.75, and the energy conversion efficiency is increased.

Although phosphorus (P) belonging to the fifth group of the periodic table is used in the above embodiment of the present invention, usable elements are not limited to P or P compounds. For example, vanadium, bismuth, etc. may be used. Also, although Ag paste is used in the above example for the front contact, metal pastes using Cu or Ni as a base metal material may be used.

The present invention may be applied to not only a singlecrystal silicon solar cell but also to a polycrystalline silicon solar cell. The anti-reflection coating may not only be $TiO_2$, but may also be $SiO_2$, $Ta_2O_5$, $Si_3N_4$, etc.

Although the solar cell front contact is manufactured by the fire-through method, the present invention may be applied to solar cell manufacture by other methods so as to increase the energy conversion efficiency.

The metal paste may include more than one element belonging to the fifth group of the periodic table.

As described above, the active impurities are diffused into the semiconductor substrate to form the pn junction layer. The front contacts are formed from a metal paste including glass frits, organic binder, solvent, and an element belonging to the fifth group of the periodic table. Accordingly, during the firing of the metal paste, the front contacts are fired through the anti-reflection coating by the synergistic effect between the glass frits and the group five element included in the metal paste. Therefore, the ohmic contact between the front contacts and the diffused layer of the substrate is very good. The current-voltage characteristic of the solar cell is improved and the energy conversion efficiency is increased.

The invention being thus described, it will be obvious that the same may be varied in many ways. Such variations are not to be regarded as a departure from the spirit and scope of the invention, and all such modifications are intended to be included within the scope of the following claims.

What is claimed is:

1. In a silicon solar cell in which active impurities are diffused into a silicon semiconductor substrate to form a pn junction layer and having a front contact formed from a metal paste, said metal paste including a metal powder which functions as a basic contact material, glass frits, an organic binder, and a solvent, the improvement comprising:
   0.05 to 0.3%, by weight, of elemental phosphorous (P) being included in said metal paste to improve resistance contact between said front contact and said substrate, said solar cell having a fill factor of about 0.75.

2. The solar cell of claim 1, wherein said metal paste is an Ag paste.

3. A silicon solar cell comprising:
   a silicon semiconductor substrate;
   a diffusion layer provided in the semiconductor substrate by diffusing active dopant impurities therein;
   an anti-reflection coating formed on said diffusion layer for preventing light from reflecting off of the surface of the solar cell; and
   a front contact formed on the diffusion layer by firing through said anti-reflection coating to form a sufficiently low-resistance ohmic contact between the diffusion layer and the contact, said contact being formed from a metal paste comprising metal powder as a main contact material, glass frits, and 0.05 to 0.3%, by weight, of elemental phosphorous (P) or a phosphorous compounds, said metal of said metal paste material being selected from the group consisting of Ag or Cu, said solar cell having a fill factor of about 0.75.

4. The solar cell of claim 3, wherein said anti-reflection coating is made of an electrically insulating material selected from the group consisting of $TiO_2$, $SiO_2$, and $Si_3N_4$.

5. The solar cell of claim 3, wherein said metal paste includes an organic binder and a solvent.

* * * * *